United States Patent
Watkins et al.

(10) Patent No.: US 10,404,225 B2
(45) Date of Patent: Sep. 3, 2019

(54) AMPLIFIER CIRCUITRY AND METHOD FOR AMPLIFYING A SIGNAL USING SAID AMPLIFIER CIRCUITRY

(71) Applicant: KABUSHIKI KAISHA TOSHIBA, Tokyo (JP)

(72) Inventors: Gavin Watkins, Bristol (GB); Konstantinos Mimis, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/506,616

(22) PCT Filed: Jun. 26, 2015

(86) PCT No.: PCT/GB2015/051864
§ 371 (c)(1),
(2) Date: Feb. 24, 2017

(87) PCT Pub. No.: WO2016/207582
PCT Pub. Date: Dec. 29, 2016

(65) Prior Publication Data
US 2018/0102750 A1    Apr. 12, 2018

(51) Int. Cl.
*H03F 3/19* (2006.01)
*H03F 3/193* (2006.01)
(Continued)

(52) U.S. Cl.
CPC ........... *H03F 3/193* (2013.01); *H03F 1/0222* (2013.01); *H03F 1/0294* (2013.01); *H03F 1/26* (2013.01);
(Continued)

(58) Field of Classification Search
CPC .................................. H03F 3/193; H03F 1/26
See application file for complete search history.

(56) References Cited

U.S. PATENT DOCUMENTS 7,808,313 B2 * 10/2010 Markowski ........... H03F 1/0227
330/136
8,610,503 B2 * 12/2013 Kaczman ................ H03F 1/083
330/124 R
(Continued)

FOREIGN PATENT DOCUMENTS

DE    10 2012 210 249 A1    12/2013
EP     2 840 710 A1     2/2015
(Continued)

OTHER PUBLICATIONS

International Preliminary Report on Patentability and Written Opinion issued by The International Bureau of WIPO dated Jan. 4, 2018, for International Application No. PCT/GB2015/051864.
(Continued)

*Primary Examiner* — Patricia T Nguyen
(74) *Attorney, Agent, or Firm* — Finnegan, Henderson, Farabow, Garrett & Dunner, L.L.P.

(57) ABSTRACT

In one aspect the embodiments relate to amplifier circuitry comprising an outphasing region and envelope tracking region. The outphasing region includes a signal processing block capable of receiving an amplitude and phase modulated input signal that is to be amplified, and processing said signal to separate it into two signals (S1, S2) of constant amplitude and modulated phase, a first signal S1 for driving a first RF power amplifier RF PA1 and a second signal S2 for driving a second RF power amplifier RF PA2. The output signals from each of the RF PAs are then provided to a power combiner (PC) for obtaining an output amplified signal (RF output). The envelope tracking region (100*b*) includes a linear amplifier (Env Amp) capable of receiving an input representing an envelope of the input signal that to be amplified, a charge storage device C1 coupled to said amplifier for providing an amplified envelope signal for driving the RF PAs, said amplifier (8) and charge storage
(Continued)

device C1 being arranged to receive a supply voltage V+. The amplifier circuitry is configured such that when the first signal S1 and the second signal S2 in the outphasing circuit 100a are in phase, an input voltage V1 based on the voltage of the received envelope signal is provided to the amplifier in the envelope tracking region to enable the charge storage device C1 to supply a voltage V2 above the supply voltage V+ such that the output voltage of the RF PAs driven by the amplifier (8) is increased by V2 above the supply voltage V+.

12 Claims, 6 Drawing Sheets

(51) Int. Cl.
    *H03F 1/02* (2006.01)
    *H03F 1/26* (2006.01)
    *H03F 3/21* (2006.01)
(52) U.S. Cl.
    CPC ......... *H03F 3/21* (2013.01); *H03F 2200/102* (2013.01)

(56) References Cited

U.S. PATENT DOCUMENTS

| | | | | |
|---|---|---|---|---|
| 8,717,100 B2 * | 5/2014 | Reisner | ................ | H03F 1/0222 330/127 |
| 8,824,978 B2 * | 9/2014 | Briffa | ................ | H03F 1/32 330/124 R |
| 8,981,847 B2 * | 3/2015 | Balteanu | ................ | H03F 1/02 330/136 |
| 9,543,910 B2 * | 1/2017 | Adabi et al. | ............ | H03F 3/217 |
| 9,768,731 B2 * | 9/2017 | Perreault | ............... | H03G 3/004 |
| 9,866,178 B2 * | 1/2018 | Anderson | ................ | H03F 1/26 |
| 9,948,240 B2 * | 4/2018 | Khlat | ................ | H03F 1/0227 |
| 2006/0078067 A1 | 4/2006 | Brobston | | |
| 2007/0133985 A1 | 6/2007 | Cho et al. | | |
| 2007/0254622 A1 | 11/2007 | Matsuura et al. | | |
| 2008/0019459 A1 | 1/2008 | Chen et al. | | |
| 2010/0073084 A1 | 3/2010 | Hur et al. | | |
| 2010/0128775 A1 | 5/2010 | Kim et al. | | |
| 2013/0210376 A1 | 8/2013 | Hur et al. | | |
| 2015/0102859 A1 | 4/2015 | Maniwa et al. | | |

FOREIGN PATENT DOCUMENTS

| | | | |
|---|---|---|---|
| JP | 2006-129402 A | 5/2006 | |
| JP | 2007-300400 A | 11/2007 | |
| JP | 2011-151464 A | 8/2011 | |
| JP | 2014-045335 A | 3/2014 | |
| JP | 2015-080080 A | 4/2015 | |
| WO | WO 2008/099724 A1 | 8/2008 | |
| WO | WO 2012/023624 A1 | 2/2012 | |
| WO | WO 2014/070474 A1 | 5/2014 | |
| WO | WO 2014/070475 A1 | 5/2014 | |

OTHER PUBLICATIONS

International Search Report by the International Bureau of WIPO on Mar. 23, 2016, for International Application No. PCT/GB2015/051864.

* cited by examiner

AMPLIFIER CIRCUITRY AND METHOD FOR AMPLIFYING A SIGNAL USING SAID AMPLIFIER CIRCUITRY

FIELD

Embodiments described herein relate generally to amplifier circuitry and particularly power efficient amplifier circuitry. Embodiments described herein specifically relate to amplifier circuitry including an outphasing amplifier and an envelope amplifier with a charge storage device coupled to said envelope amplifier for driving a supply voltage of RF amplifiers.

BACKGROUND

Many communications systems in use today (i.e. LTE and DVB) are based on orthogonal frequency division multiplexing (OFDM) modulation. While OFDM has the advantage of tolerance to delay spread and is spectrally efficient, it does so at the expense of a high peak-to-average power ratio (PAPR). The high PAPR of OFDM results in low average RF power amplifier (PA) efficiency.

Historically, RF power amplifiers (RF PAs) have been linear devices. With the advent of high peak-to-average power ratio (PAPR) communications and broadcast standards like LTE and DVB, the RF PA is forced to operate in a low efficiency region of its transfer function, if the signal is to be amplified with high fidelity.

A number of amplifier architectures exist to increase PA efficiency under these conditions. For instance, load modulation architectures such as Doherty exists, which uses a circuitry having two amplifiers that modulate each other's load depending on the required output power. Amplifier circuitry with envelope modulators for signal envelope tracking has also been used. Another type of circuit for increasing RF PA efficiency is the outphasing amplifier. Such a circuit uses an isolating combiner with saturated amplifier stages to achieve high linearity and good peak efficiency. Outphasing amplifier circuits using a non-isolating combiner to enable load modulation also exist. Although such amplifier architectures in theory do result in some efficiency increase, in use the improvements are limited. There still exists the problem low average efficiency when amplifying contemporary communications signals like LTE.

Recently, hybrid schemes combining an outphasing amplifier with an envelope tracking power supply have been studied. However, existing hybrid approaches proposed are complicated and involve the switching of supply voltages/gain to the RF PA, which is likely to introduce noise into the system.

There therefore exists a need for to overcome the limited back-off efficiency of the classic outphasing architectures, and the complicated circuits of the noisy hybrid architectures for RF power amplifier applications.

DETAILED DESCRIPTION

The embodiments provide an amplifier circuitry having an envelope amplifier coupled to a charge storage device and an outphasing amplifier to increase efficiency of an RF Power Amplifier (RF PA)

In once aspect, the invention relates to amplifier circuitry comprising an outphasing region and envelope tracking region, the outphasing region including a signal processing block capable of receiving an amplitude and phase modulated input signal that is to be amplified, and processing said signal to separate it into two signals S1,S2 of constant amplitude and modulated phase, a first signal S1 for driving a first RF power amplifier RF PA1 and a second signal S2 for driving a second RF power amplifier RF PA2, the output signal from each of the RF PAs being provided to a power combiner (PC) for obtaining an output amplified signal (RF output); and an envelope tracking region including a linear amplifier (Env Amp) capable of receiving an input representing an envelope of the input signal that to be amplified, a charge storage device coupled to said amplifier for providing an amplified envelope signal for driving the RF PAs, said amplifier and charge storage device being arranged to receive a supply voltage V+;

wherein the amplifier circuitry is configured such that when the first signal S1 and the second signal S2 in the outphasing circuit are in phase, an input voltage V1 based on the voltage of the received envelope signal is provided to the amplifier in the envelope tracking region of the amplifier circuitry, to enable the charge storage device to supply a voltage V2 above the supply voltage V+ such that the output voltage of both RF PAs driven by the amplifier is increased by V2 above the supply voltage V+.

In another aspect the invention provides amplifier circuitry comprising an outphasing region and envelope tracking region, the outphasing region including a signal processing block capable of receiving an amplitude and phase modulated input signal that is to be amplified, and processing said signal to separate it into two signals (S1,S2) of constant amplitude and modulated phase, a first signal S1 for driving a first RF power amplifier RF PA1 and a second signal S2 for driving a second RF power amplifier RF PA2, the output signal from each of the RF PAs) being provided to a power combiner (PC) for obtaining an output amplified signal (RF output); and an envelope tracking region 1 including a first linear amplifier (Env Amp) capable of receiving an input representing an envelope of the input signal that to be amplified, a first charge storage device coupled to said first amplifier for providing an amplified envelope signal for driving the first RF PA, the envelope tracking region further including a second linear amplifier (Env Amp) capable of receiving an input representing the envelope of the input signal, a second charge storage device coupled to said second amplifier for providing an amplified envelope signal for driving the second RF PA, said amplifier and charge storage device being also arranged to receive a supply voltage V+;

wherein the amplifier circuitry is configured such that when the first signal S1 and the second signal S2 in the outphasing circuit are in phase, an input voltage V1 based on the voltage of the received envelope signal is provided to the first linear amplifier in the envelope tracking region of the amplifier circuitry, to enable the first charge storage device to supply a voltage V2 above the supply voltage V+ such that the output voltage of the first RF PA driven by the first linear amplifier is increased by V2 above the supply voltage V+; and wherein responsive to a maximum value of V2 for driving the RF PA1 being reached in the envelope tracking circuit, the amplifier circuitry is configured such that an input voltage V3 based on the voltage of the received envelope signal is provided to the second linear amplifier to enable the second charge storage device to supply a voltage V4 above the supply voltage V+ such that the output voltage of the second RF PA driven by the second linear amplifier is increased by V4 above the supply voltage V+.

In a further aspect the invention provides a method for amplifying a signal using an amplifier circuitry as set out above comprising the steps of:

providing an amplitude and phase modulated input signal that is to be amplified to an outphasing region of the amplifier circuitry, wherein the input signal is provided to a signal processing block to obtain two separate signals, a first signal S1 and a second S2, S1 and S2 being of constant amplitude and of modulated phase, S1 for driving a first power amplifier RF PA1 and S2 for driving a second power amplifier RF PA 2;

representing an envelope of the signal to be amplified to at least one amplifier (in an envelope tracking region 1;

providing a charge storage device coupled to the amplifier for providing an amplified envelope signal;

providing a supply voltage V+ to the amplifier and charge storage device;

wherein, when the first and second signal S1, S2 are in phase, the method further comprises:

providing an input voltage (V1, V3) based on the voltage of the envelope of the input signal to an envelope amplifier to enable the charge storage device to supply a voltage (V2, V4) above a supply voltage V+ such that the output voltage of the RF PA driven by the amplifier is increased by above the supply voltage V+.

Conventional amplifiers have a low average efficiency when amplifying contemporary communications signals like LTE. A number of amplifier architectures exist to increase RF Power amplifier (PA) efficiency for signals having high peak-to-average power ratio (PAPR) and broadcast standards like LTE and DVB.

Figure 1A:
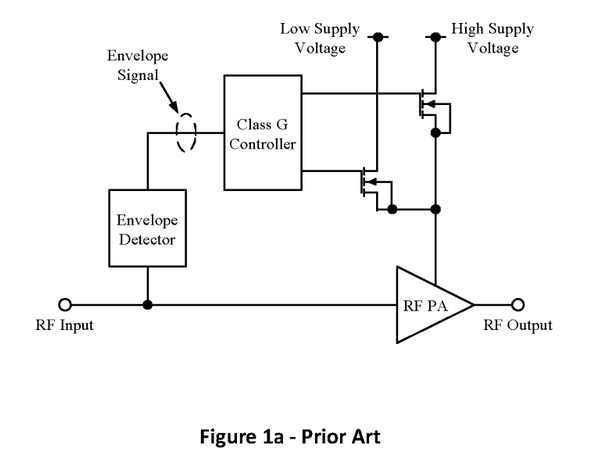
FIG. 1a shows an existing envelope modulator for RF amplifiers

One type of known amplifier architecture for increasing efficiency of an RF PA uses an envelope modulator so that the voltage output of the envelope modulator is directly applied to a voltage supply input of an RF PA. This is shown for instance in FIG. 1a which shows a configuration where the envelope modulator is of a single band type. In this configuration the entire bandwidth of the envelope signal is applied to the input of the amplifier. When a class G amplifier configuration is used in FIG. 1a, then this has a bandwidth that is sufficient to amplify the entire bandwidth of the envelope signal so that the output signal provided by the amplifier provides a low frequency or DC output as well as high frequency AC output, both reflecting the low frequency/DC and the AC components of the input envelope signal. The voltage output by the amplifier of the envelope modulator in FIG. 1a is then directly applied to the RF amplifier. However, such type of envelope modulator has a low efficiency when since it amplifies the entire bandwidth of the signal.

Figure 1B:
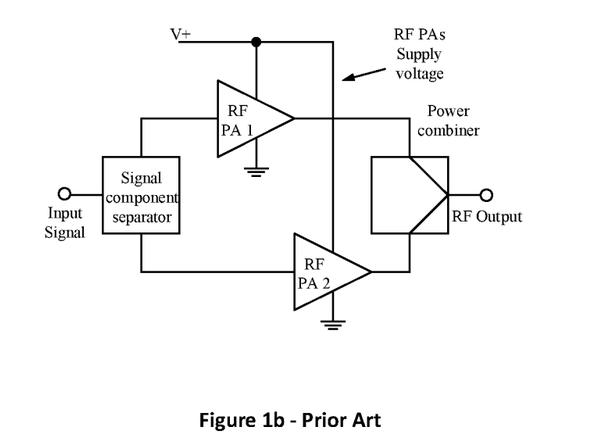
FIG. 1b shows a conventional outphasing amplifier circuit.

A known amplifier architecture for improving RF PA efficiency for OFDM signals having high peak-to-average power ratio (PAPR) is the outphasing amplifier architecture, as shown in FIG. 1b. The circuitry consists of two RF Power amplifiers, RF PA1 and RF PA2 which are driven into saturation so that they operate in the high efficiency region of their transfer characteristic. The output signals of these two RF PAs are summed in a power combiner (PC) 10. As seen in the circuit of FIG. 1b, a baseband input signal 2 is applied to a signal component separator (SCS) 4 which derives the two drive signals S1, S2 for RF PA1 and RF PA2, respectively. The phase relationship between these two signals determines the amplitude of the combined signal. When the two signals S1 and S2 are in-phase, they sum i.e. maximum amplitude is reached. When in anti-phase they cancel each other out resulting in amplitude null i.e. minimum or no amplitude. The phase relationship between the two signals can recreate any amplitude combination in the outphasing amplifier.

Outphasing architecture as described above relates to a class of amplifiers that seem to operate on slightly different principles, but are regarded as being the same, i.e. Chireix, Ampliphase, Combined Analogue-Locked Loop Universal Modulator (CALLUM), and Linear amplification using Nonlinear Components (LINC).

FIG. 1b depicts a simple form of LINC outphasing architecture, i.e. where the power combiner 10 is a Wilkinson, i.e. an isolating type of power combiner. Because of this, there is no load modulation effect in the LINC amplifier. With this, high Peak to average (PAR) signals suffer from a reduced efficiency since the amplifiers operate at a constant power even when the required signal output is low.

However, this does not have to be the case for all outphasing architectures. In the case of the Chireix amplifier, a non-isolating type of power combiner is used whereby the output signal from one PA load "pulls" the other PA. This may be theoretically more efficient, as the design enables load modulation resulting in an improved average efficiency for signals with amplitude modulation. However, such a circuit is much harder to design and operate, since the degree of load-pulling is hard to calculate and these effects cannot be simulated.

Figure 2:
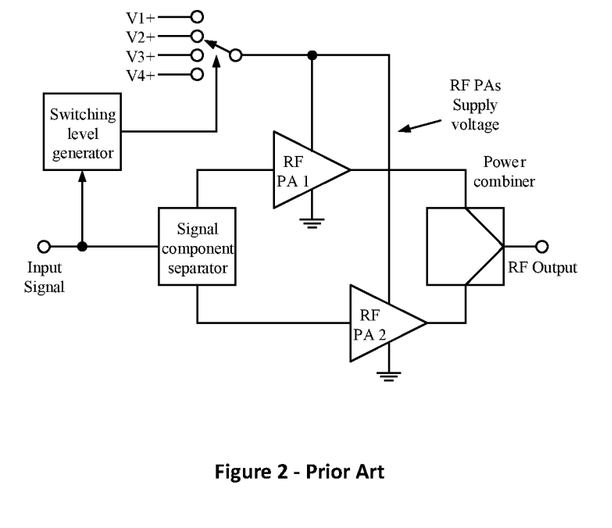
FIG. 2 shows an existing multilevel outphasing architecture for RF amplifiers

Although the Outphasing architecture in theory increases RF PA efficiency, in its original design, the improvement is limited. In an attempt to address this and provide amplifier circuitry with better operational efficiency, more recently hybrid schemes have been introduced which combine both the outphasing architecture with envelope tracking architectures. The existing hybrid schemes are based on dynamically switching a supply voltage to the RF PAs between a number of discrete levels based on an envelope input signal, and also using the outphasing amplifier as shown in FIG. 2. In this design, the supply voltage to the RF PAs is switched by a Switching level generator (SLG) between four levels of different magnitude (V1+ to V4+). Any number of supply voltages could be used. In this example both the RF PAs share a common switched supply voltage, but they could be independent. The remaining components are the same as the conventional outphasing architecture of FIG. 1b.

Figure 3:
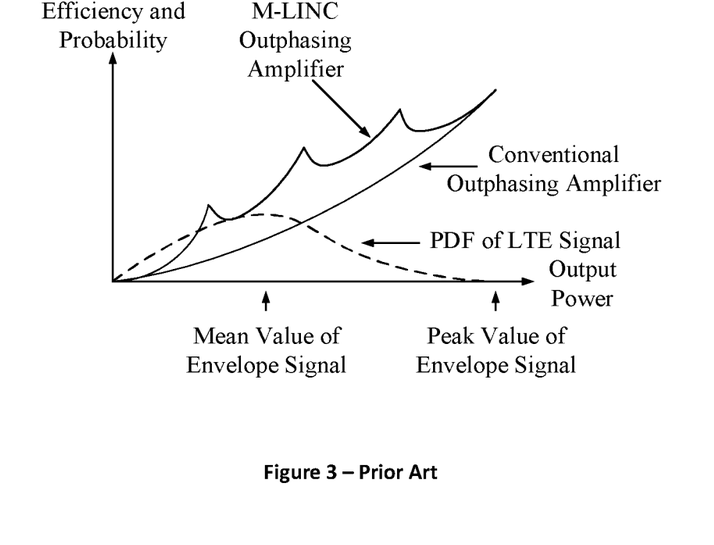
FIG. 3 depicts the differences in the operation of the known amplifier circuits in FIGS. 1b and 2.

The system of FIG. 2 is referred to as multilevel-LINC (M-LINC). Its operation in comparison with the conventional outphasing amplifier of FIG. 1b is depicted along with its efficiency profile in FIG. 3. It is seen that for the conventional outphasing amplifier of FIG. 1b, efficiency decreases rapidly as the output power is backed-off. By switching the supply voltage in the circuit of FIG. 2, the efficiency profile now has four peaks. The probability density function (PDF) of an LTE signal is also shown in FIG. 3. It can be seen that the majority of the signal resides at a mean value significantly smaller than the peak value. At the mean value, the M-LINC outphasing amplifier of FIG. 2 can be seen to have a higher efficiency than the conventional one, therefore average efficiency is increased when amplifying an LTE signal.

In the M-LINC amplifier of FIG. 2, the two signals produced by the two RF amplifiers have the same amplitude. In the examples in above discussion of outphasing amplifiers, both RF amplifiers shared a common switched supply voltage. Therefore, they produce the same output amplitude.

As explained above, conventional envelope modulators such as in FIG. 1a have a low average efficiency when amplifying contemporary communications signals like LTE. Using conventional Outphasing amplifier circuits as seen in FIG. 1b provide a very limited improvement in efficiency. The architecture shown in FIG. 2 does increase the average efficiency, but the existing hybrid circuits are complicated and the switching of supply voltages/gain is introduces noise into the system.

There therefore exists a need for amplifier architecture which overcomes drawbacks of the limited back-off efficiency of the classic outphasing architectures, and the complicated an noisy circuits of the existing hybrid architectures.

The embodiments described herein overcome the drawbacks of existing outphasing amplifier configurations for increasing RF power amplifier efficiency, especially for signals having high peak-to-average power ratio (PAPR), i.e. broadcast standards like LTE and DVB. The present embodiments propose a hybrid amplifier circuitry making using of both, envelope tracking and outphasing by using an envelope amplifier coupled to a charge storage device, and an outphasing amplifier to increase efficiency of RF Power Amplifiers (RF PAs).

Figure 4:
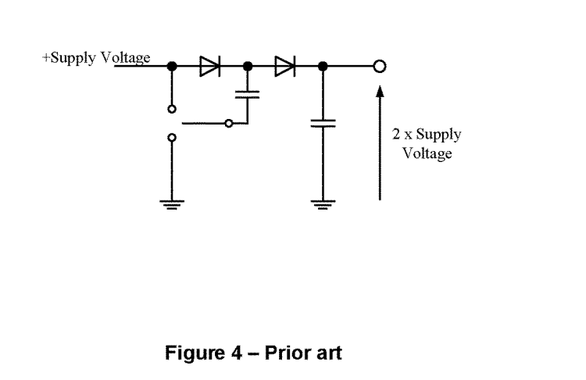
FIG. 4 shows a known charge pump voltage doubler.

The present embodiment incorporates a linear charge pump in an envelope modulator. An example of charge pump is shown in FIG. 4, which is capable of producing an output voltage which is double its input. In known arrangements for a charge pump voltage doubler, a switch is used to charge one capacitor from the supply voltage and then switch it in series with the supply voltage. When connected in series with the supply voltage, charge is passed to the output capacitor which maintains twice the supply voltage. A number of charge pumps can be cascaded to achieve higher output voltages. However such charge pumps are not generally dynamically controllable and the output voltage is non-linear and is always a multiple of the input.

As will be explained below and seen with reference to FIGS. 5 to 8, the described embodiments provide a considerably simpler circuit than existing hybrid amplifier designs and overcome all above mentioned existing drawbacks. The present invention provides an amplifier circuitry that uses outphasing as well as signal envelope tracking. The circuit 100 incorporates a linear charge pump, i.e. it incorporates an envelope amplifier coupled with a charge storage device, to drive a supply voltage V+ to an RF Power amplifier based on the envelope of an input signal, once maximum amplitude is reached for the signal in an outphasing amplifier circuit.

Figure 5:
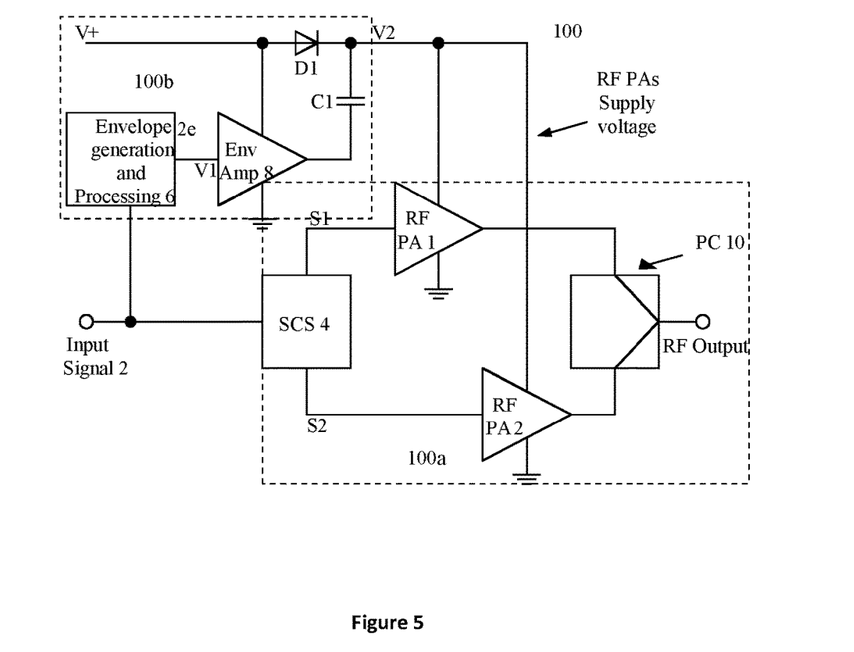
FIG. 5 shows an amplifier circuitry including an envelope amplifier coupled with a charge storage device, and an outphasing amplifier, according to an embodiment.

FIG. 5 shows amplifier circuitry 100 according to a first embodiment. The circuitry 100 consists of an outphasing circuit or outphasing region 100a and an envelope tracking circuit or envelope tracking region 100b. The outphasing circuit 100a shown in FIG. 5 is similar to the conventional outphasing architecture shown FIG. 1b. Other suitable outphasing amplifier architectures may also be used in the amplifier circuitry 100 of FIG. 5. The outphasing circuit 100a in the embodiment shown in FIG. 5 includes two RF Power amplifiers, RF PA1 and RF PA2, a signal component separator (SCS) 4 and power combiner (PC) 10. A Baseband input signal 2 is applied as input to SCS 4.

The SCS 4 is an outphasing specific signal processing block which performs a signal decomposition or signal splitting function of the input signal 2. In the signal splitting operating, the input signal 2 is transformed from one that is both amplitude and phase modulated, into two separate signals S1 and S2 with modulated phase and constant amplitude i.e. two out-phased constant-envelope signals S1 and S2. For the outphasing region 100a, the two signals S1 and S2 have a common phase modulation component and a differential phase modulation component. The common phase modulation carries phase information of the original signal. The differential phase modulation contains information about the original amplitude modulation. This decomposition is common to all types of outphasing amplifiers. There is no time varying amplitude component in the signals S1 and S2. These two constant-envelope signals, when recombined recreate the original input signal 2 in terms of amplitude and phase information.

The SCS 4 therefore derives the two drive signals S1and S2 that are provided as input for RF PA1 and RF PA2, respectively and are amplified separately. The two RF PAs are each driven into saturation so that they operate in the high efficiency region of their transfer characteristic. The output signals $S1_{out}$ and $S2_{out}$ of these two RF PAs are summed in a power combiner 10, i.e. an isolating or non-isolating power combiner circuit (PC) 10, similar to the power combiner seen in the circuit of FIG. 1b. The phase relationship between these two signals determines the amplitude of the combined signal seen at RF output of PC 10. When the two signals S1 and S2 are in-phase, they sum. When in anti-phase they cancel each other out, thereby resulting in amplitude null at RF output.

In the present embodiment shown in FIG. 5, when maximum amplitude is achieved in the outphasing circuit 100a, i.e. the phase difference between the two signal S1 and S2 is zero, the envelope tracking operation or region is entered i.e. the envelope tracking circuit 100b is then used for driving the two RF amplifiers RF PA1 and RF PA2. In this region 100b, the input signal 2 is provided to an envelope generation and processing circuit 6 to derive an envelope 2e of the input signal 2. Here, the signals S1 and S2 in the outphasing region 100a are kept in-phase, and a positive supply voltage V+ to each PA is increased, i.e. doubled, by a charge pump when the envelope tracking phase 100b or region is entered. The envelope tracking circuit 100b includes an envelope amplifier (Env Amp) 8, the diode D1 and charge storage device, i.e. capacitor C1. Env Amp 8 is a linear amplifier. The supply voltage V+ is linearly increased with the envelope of the output signal from the Env Amp 8. This recreates the peaks of the signal. In the embodiment shown in FIG. 5, both RF PAs, RF PA1 and RF PA 2 are driven by the same linear charge pump circuit i.e. the charge storage device C1. The components and working of the envelope tracking region 100b is explained below.

An envelope input 2e is provided to an envelope amplifier Env Amp 8. This envelope input signal 2e represents a signal provided from an envelope generation and processing module 6 or from baseband processing (not shown in FIG. 5) that is indicative of an instantaneous magnitude of the envelope of the RF input signal 2 that is to be amplified by the amplifier circuitry 100. The output signal of Env Amp 8 of FIG. 5 drives a linear charge pump, i.e. a charge storage device C1, to improve efficiency and linearity of the output signal, which is supplied to both the RF amplifiers, RF PA1 and RF PA2.

The positive supply voltage V+ is provided to the linear amplifier Env Amp 8 and the charge storage device C1 coupled to Env Amp 8 in the envelope tracking circuit 100b. The output of Env Amp 8 is configured to drive an output load represented by the two RF power amplifiers RF PA1 and RF PA2 in FIG. 5. The two RF PAs which receives the supply voltage V+ from the charge pump in turn supplies an AC voltage to an output RF load i.e. the output of the Power combiner 10

The circuitry 100 is configured to such that it the envelope amplifier Env Amp 8 does not track the entire envelope of the RF carrier input 2 at all times. The envelope tracking circuit 100b of the circuitry 100 is only enabled when the maximum amplitude of the signal is achieved in the outphasing region 100a of the circuitry 100. Therefore, once the difference between the two components S1 and S2 of the input signal 2 in the outphasing region 100a is zero, i.e. when the amplitude is maximum, only then a voltage V1 (for envelope signal 2e) appears at the output of the envelope generation and processing circuit 6, and this is input to the Env Amp 8. By this, the voltage supply V+ to the two RF power amplifiers is doubled or increased by V1 by the charge pump C1. V1 is preferably based on the voltage range of the input envelope signal 2e that is above the certain threshold. More preferably, voltage V1 is set at or above the mean value of the dynamic voltage range of the envelope signal 2e, so that V1 always tracks the upper voltage range of the dynamic voltage range of the envelope signal 2e of the original RF input signal 2. The lower voltage range is therefore not tracked by the Env Amp 8. In the envelope tracking region, the signal V1 to the envelope amplifier Env Amp 8 is then passed to the charge storage device C1, which acts as a linear charge pump to provide an output signal V2 to the RF PA1 and RF PA2, such that this V2 is at a voltage higher than the supply voltage V+ for driving the RF PAs. In the envelope tracking region 100b, both the RF PAs operate in a non-linear or a saturation mode, i.e. preferably above the mean voltage range, and therefore in this mode the peaks of the envelope input signal 2e that are tacked by Env Amp 8. Thus, in the saturation mode for both the RF PAs, current flows through Env Amp 8 to push the charge storage device C1 to above the supply voltage V+, i.e. up to voltage V2.

When maximum voltage has not been reached in the outphasing region 100a of circuitry 100 i.e. the phase difference between S1 and S1 is non-zero, then no input voltage appears at V1 from envelope generation and processing circuit 6. In this case, the input to Env Amp 8 will be at zero V or at ground potential. In this case the output signal V2 to the RF PA1 and RF PA2 in the envelope tracking circuit 100b is fixed at the supply voltage V+. Thus, when the RF PAs operate in a linear mode at the supply voltage V+, input envelope signal is not taken into consideration by Env Amp 8. In the linear mode of the RF PAs, or rather when the outphasing region 100a is operational or active, current flows through a diode D1 shown in FIG. 5 to charge capacitor C1 according to the supply voltage V+. Only in the non-linear or saturation mode, when maximum amplitude has already been reached in the outphasing circuit 100a, current flows through Env Amp 8 to the RF PAs.

Figure 6:
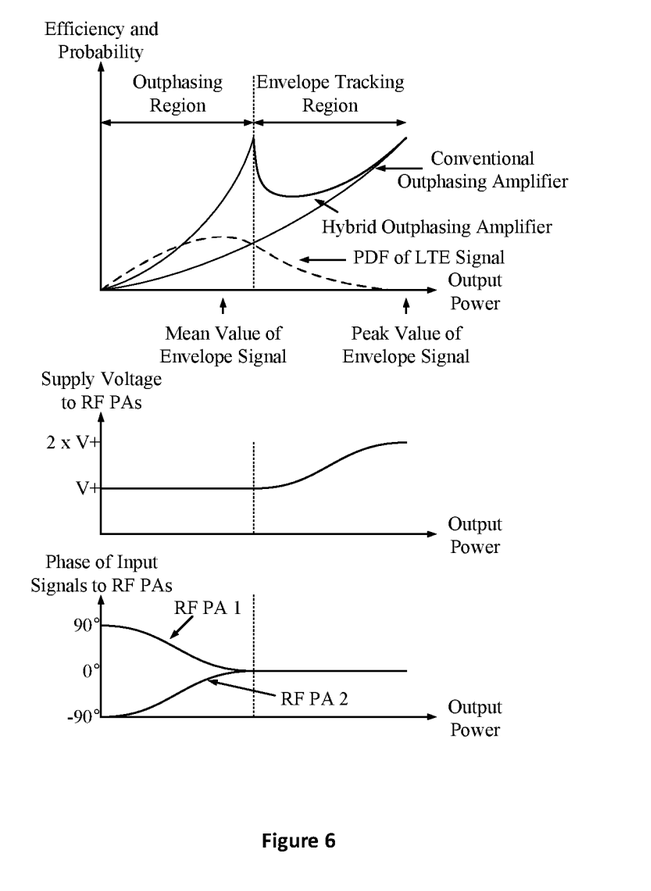
FIG. 6 shows a graph depicting the operation and efficiency profile of the amplifier circuitry of FIG. 5.

In comparison to existing envelope tracking and outphasing amplifier circuitry schemes, the embodiment seen in FIG. 5 is considerably simpler. The increase in efficiency can be seen in the efficiency profile shown in FIG. 6. As seen from the figure, there are two efficiency peaks and the efficiency profile has two distinct regions: the lower one where outphasing is used i.e. outphasing circuit 100a is operational, and the upper where envelope tracking is used according to envelope tracking circuit 100b. In the lower region conventional outphasing operation is maintained where the two RF PAs are driven into saturation and the phase relationship of their output signals determines the amplitude of the resulting signal. Peak efficiency is only achieved for the outphasing region 100a when the signals are in-phase, as shown in FIG. 6

When maximum amplitude is achieved in the outphasing region 100a, i.e. the phase difference between the two signals is zero, the envelope tracking region 100b is entered. Here the signals are kept in-phase and the supply voltage to the RF PAs increased by the charge pump formed from the Env Amp 8, the diode D1 and capacitor C1. The supply voltage is linearly increased with the envelope of the output signal. This re-creates the peaks of the signal in FIG. 6.

In the embodiment shown in FIG. 5, both RF PAs are driven by the same charge pump i.e. formed by Env Amp 8, C1 and D1. However, it is also possible to use separate charge pumps for each of the RF PA's. This embodiment is shown in the amplifier circuitry 200 in FIG. 7. This arrangement has the advantage of further increasing the number of efficiency peaks, as shown from the efficiency profile for amplifier circuitry 200 seen in FIG. 8. As with the amplifier circuitry 100, in FIG. 7 outphasing is only used in the lower envelope region. Like FIG. 5, outphasing amplifier circuit 200a is operational until maximum amplitude is achieved in the outphasing region 200a, i.e. when the phase difference between the two signals S1 and S2 from SCS 4 is zero. Envelope tracking circuit 200b is entered only once maximum amplitude in the outphasing circuit 200a is achieved. The charge pump formed by capacitor C1 and Diode D1 is arranged to first increase the supply voltage V+ to RF PA1.

Figure 7:
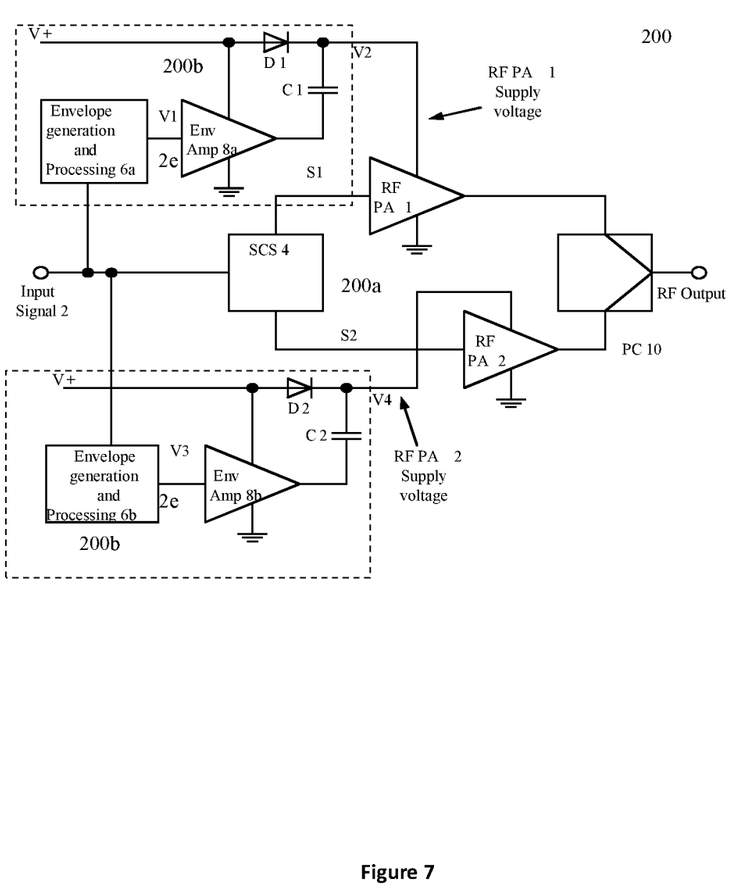
FIG. 7 shows an amplifier circuitry according to a preferred aspect of the embodiments.

The operation in the Envelope tracking region 200b is the same as described above in relation to FIG. 5. The supply voltage to RF PA1 is thus increases by V1 by the charge pump circuit for RF PA 1. Signal V1 to the envelope amplifier Env Amp 8a is passed to the charge storage device C1, which acts as a linear charge pump to provide an output signal V2 only to RF PA1.

Once the increased supply voltage has reached its maximum value (maximum value for V2), only then will the envelope amplifier 8b, capacitor C2 and Diode D2 operate to increase the supply voltage above V+ to RF PA 2.

Then a voltage V3 (for envelope signal 2e) appears at the output of the envelope generation and processing circuit 6b and this is input to the Env Amp 8b. With this, the voltage supply V+ to RF PA 2 is doubled or increased by V3 by the charge pump formed by Env Amp 8b, Diode D2 and Capacitor C2. Like V1, V3 is also preferably being based on the voltage range of the input envelope signal 2e that is above the certain threshold over the voltage V1 provided to envelope generation and processing circuit 6a, so that the supply voltage is higher than the output signal V2 provided by Env Amp 8a, capacitor C1 and Diode D1. The signal V3 to the envelope amplifier Env Amp 8b is then passed to the charge storage device C2, which acts as a linear charge pump to provide an output signal V4 to RF PA2, such that this signal V4 is at a voltage higher than the supply voltage V+ and also higher than the voltage V2, for driving the RF PA2.

Figure 8:
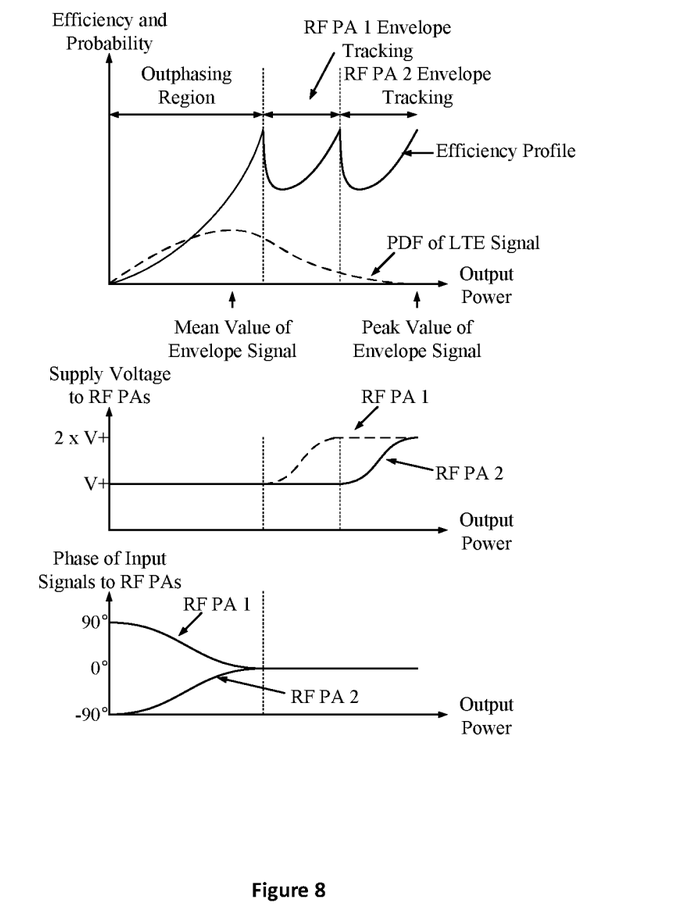
FIG. 8 shows a graph depicting the operation and efficiency profile of the amplifier circuit of FIG. 7.

Because of the increased supply voltage (V2) for RF PA1 and a further increased supply voltage (V4) for RF PA2, amplifier circuitry 200 provides more number of efficiency peaks, as shown from the efficiency profile of amplifier circuitry 200 in the graph of FIG. 8. As shown in FIG. 8, there are three distinct regions in the efficiency profile. When in the lower region (outphasing region in the graph of FIG. 8), the outputs of both Env Amp 8a and Env Amp 8b are low, and only outphasing operation occurs. When the signals S1 and S2 are in-phase, i.e. maximum amplitude is achieve in the outphasing region 200a, then the output of amplifier Env Amp 8a will start to increase, and this is the second distinct region (RF PA1 envelope tracking region in the figure). This can be considered as a semi-envelope tracking region since the output of the further Env Amp 8b is fixed at this time. The signals appearing at the output of RF PA1 and RF PA2 are not equal. The output of Env Amp 8a will continue to track the voltage range of the envelope 2e until V2 has reached its maximum value. Once this is reached, the output of Env Amp 8b will start to track the voltage range of the envelope 2e. This is the third distinct region (the RF PA 2 envelope tracking region in the figure). A maximum output is reached when V4 is also at its maximum value. This value may be double the supply voltage V+, for instance.

For the embodiments shown in FIGS. 5 and 7, some practical system non-idealities (for example AM-PM non-linearities etc.) and/or time misalignment between the various input signals, when taken into consideration, may sometimes degrade system performance and linearity. However, in the amplifier circuitry 100 and 200 of the present embodiments, this could be overcome by controlling the phase relationship of the input signals in the envelope tracking region 100b and 200b.

Compared to the conventional outphasing architecture seen in FIGS. 1a, 1b and 2, the present embodiments will result a higher efficiency, therefore reducing power consumption. This advantage can be seen from the efficiency profile of amplifier circuitry 100 shown in FIG. 6. The second peak at back-off on the efficiency profile shown in FIG. 6 is evident of increased efficiency.

The efficiency profile also shows that the supply voltage to the RF PAs is constant during the operation in outphasing region 100a, but then increased during the envelope tracking region 100b. In contrast, the phase relationship of the signals produced by RF PA 1 and FR PA 2 is shown to be zero and constant during the envelope tracking region 100b and vary during the outphasing region 100a to reduce the output power. As seen in FIG. 5, envelope tracking region 100b is only entered when the two amplifier outputs are in phase (zero degrees). As output power is backed-off they deviate to +90° and −90° so they are in anti-phase at the minimum output power and hence cancel each other.

Furthermore, the prior art M-LINC systems as seen in FIG. 2 generally require multiple power supplies for each of the different voltages. This is costly and consumes a large volume. The embodiments shown in FIGS. 5 and 7 only require one power supply since the charge pump doubles the voltage at the peaks.

For the amplifier circuitry 100 and 200 in FIGS. 5 and 7, respectively, the expected output power level is 1-5 W. Therefore, this amplifier circuitry architecture is suitable for a wide range of applications, such as for use in WiFi devices, mobile phones, small base stations and repeater/relay networks and other kinds of transceivers and similar devices.

While certain embodiments have been described, these embodiments have been presented by way of example only, and are not intended to limit the scope of the inventions. Indeed, the novel devices, methods, and products described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope of the embodiments.

The invention claimed is:

1. Amplifier circuitry 100 comprising an outphasing region 100a and envelope tracking region 100b,
    the outphasing region 100a including a signal processing block 4 capable of receiving an amplitude and phase modulated input signal 2 that is to be amplified, and processing said signal 2 to separate it into two signals (S1,S2) of constant amplitude and modulated phase, a first signal S1 for driving a first RF power amplifier (RF PA) RF PA1 and a second signal S2 for driving a second RF power amplifier (RF PA) RF PA2, the output signal from each of the RF PAs (RF PA1, RF PA2) being provided to a power combiner (PC) 10 for obtaining an output amplified signal (RF output); and
    an envelope tracking region 100b including a linear amplifier (Env Amp) 8 capable of receiving an input representing an envelope 2e of the input signal 2 that to be amplified, a charge storage device C1 coupled to said amplifier 8 for providing an amplified envelope signal for driving the RF PAs (RF PA 1 and RF PA2), said amplifier 8 and charge storage device C1 being arranged to receive a supply voltage V+;
    wherein the amplifier circuitry 100 is configured such that when the first signal S1 and the second signal S2 in the outphasing circuit 100a are in phase, an input voltage V1 based on the voltage of the received envelope signal 2e is provided to the amplifier 8 in the envelope tracking region 100b of the amplifier circuitry 100, to enable the charge storage device C1 to supply a voltage V2 above the supply voltage V+ such that the output voltage of both RF PAs driven by the amplifier 8 is increased by V2 above the supply voltage V+.

2. The amplifier circuitry 100 as claimed in claim 1 wherein the envelope tracking region 100a including an envelope generation and processing module 6 for receiving the input signal 2 and generating the envelope signal 2e, said module 6 further being capable of providing the input signal V1 to the amplifier 8 based on the voltage of the envelope signal 2e when said first and second signals S1, S2 in the outphasing circuit 100a are in phase.

3. Amplifier circuitry 100 comprising an outphasing region 100a and envelope tracking region 100b,
    the outphasing region 100a including a signal processing block 4 capable of receiving an amplitude and phase modulated input signal 2 that is to be amplified, and processing said signal 2 to separate it into two signals (S1,S2) of constant amplitude and modulated phase, a first signal S1 for driving a first RF power amplifier (RF PA) RF PA1 and a second signal S2 for driving a second RF power amplifier (RF PA) RF PA2, the output signal from each of the RF PAs (RF PA1,RF PA2) being provided to a power combiner (PC) 10 for obtaining an output amplified signal (RF output); and an envelope tracking region 100b including a first linear amplifier (Env Amp) 8a capable of receiving an input representing an envelope 2e of the input signal 2 that to be amplified, a first charge storage device C1 coupled to said first linear amplifier 8 for providing an amplified envelope signal for driving the first RF PA (RF PA 1), the envelope tracking region 100b further including a second linear amplifier (Env Amp) 8b capable of receiving an input representing the envelope 2e of the input signal 2, a second charge storage device C2 coupled to said second linear amplifier 8b for providing an amplified envelope signal for driving the second RF PA (RF PA 2), said amplifier 8b and charge storage device C2 being also arranged to receive a supply voltage V+;

wherein the amplifier circuitry 100 is configured such that when the first signal S1 and the second signal S2 in the outphasing circuit 100a are in phase, an input voltage V1 based on the voltage of the received envelope signal 2e is provided to the first linear amplifier 8a in the envelope tracking region 100a of the amplifier circuitry 100, to enable the first charge storage device C1 to supply a voltage V2 above the supply voltage V+ such that the output voltage of the first RF PA (RF PA 1) driven by the first linear amplifier 8a is increased by V2 above the supply voltage V+; and wherein responsive to a maximum value of V2 for driving the RF PA1 being reached in the envelope tracking circuit 100b, the amplifier circuitry 100 is configured such that an input voltage V3 based on the voltage of the received envelope signal 2e is provided to the second linear amplifier 8b to enable the second charge storage device C2 to supply a voltage V4 above the supply voltage V+ such that the output voltage of the second RF PA (RF PA 2) driven by the second linear amplifier 8b is increased by V4 above the supply voltage V+.

4. The amplifier circuitry 100 as claimed in claim 3 wherein the envelope tracking region 100a including a first and second envelope generation and processing module 6a, 6b for receiving the input signal 2 and generating the envelope signal 2e;

wherein when said first and second signals S1, S2 in the outphasing circuit 100a are in phase, the first module 6a is configured for providing the input signal V1 to the amplifier 8a based on the voltage of the envelope signal 2e, and the second module 6b is configured for providing the input signal V3 to the amplifier 8b based on the voltage of the envelope signal 2e.

5. The amplifier circuitry 100 as claimed in claim 1 wherein PC 10 is an isolating power combiner or a non-isolating power combiner.

6. The amplifier circuitry 100 as claimed in claim 1 wherein the signal processing block 4 in the outphasing region 100a is a signal component separator (SCS) configured for performing a signal decomposition operation for splitting the input signal 2 into the first and second signals S1, S2, the two signals having constant amplitude and being phase modulated.

7. The amplifier circuitry 100 as claimed in claim 1 wherein amplitude of the combined output signal (RF output) obtained from PC 10 is determined based on the phase difference between the first and second signals S1, S2 in the outphasing region 100a, whereby
   when S1 and S2 are in phase such the phase difference is zero, the amplitude of the combined out signal is maximum at RF output; and
   when the first and second signals are in anti-phase such that the phase difference is maximum, the amplitude is null at RF output.

8. The amplifier circuitry 100 as claimed in claim 1 wherein the charge storage device (C1, C2) is a capacitor.

9. The amplifier circuitry as claimed in claim 8 wherein, if there is a non-zero phase difference between the first and second signals S1, S2 in the outphasing region 100a, then the supply voltage V+ flows through a diode to charge the capacitor(s) in the envelope tracking region 100b to the supply voltage V+ for supplying a charge at the supply voltage V+ to the load (RF output) driven by the amplifier circuitry 100.

10. The amplifier circuitry 100 as claimed in claim 8 wherein, when the first and second signals S1,S2 in the outphasing region 100a are in phase, the input signal (V1, V3) provided to the linear amplifier (8, 8a) causes an increase in the charge stored in the capacitor (C1,C2) above the supply voltage V+, wherein the charge (V2,V4) supplied by the capacitor (C1,C2) is also increased by the same amount such that the output voltage of the load driven by the amplifier (8a, 8b) is increased above the supply voltage V+.

11. A base station or a transmitter comprising amplifier circuitry 100 according to claim 1.

12. A method for amplifying a signal using the amplifier circuitry 100 of claim 1 comprising the steps of:
   providing an amplitude and phase modulated input signal 2 that is to be amplified to an outphasing region 100a of the amplifier circuitry 100, wherein the input signal 2 is provided to a signal processing block 2 to obtain two separate signals, a first signal S1 and a second S2, S1 and S2 being of constant amplitude and of modulated phase, S1 for driving a first power amplifier RF PA1 and S2 for driving a second power amplifier RF PA 2;
   representing an envelope of the signal to be amplified to at least one amplifier (8, 8a, 8a), in an envelope tracking region 100b;
   providing a charge storage device C1, C2 coupled to the amplifier for providing an amplified envelope signal;
   providing a supply voltage V+ to the amplifier and charge storage device C1, C2;
   wherein when the first and second signal S1, S2 are in phase, the method further comprises:
   providing an input voltage V1, V3 based on the voltage of the envelope 2e of the input signal 2 to an envelope amplifier 8, 8a to enable the charge storage device C1, C2 to supply a voltage V2, V4 above a supply voltage V+ such that the output voltage of the RF PA driven by the amplifier is increased by above the supply voltage V+.

* * * * *